(12) United States Patent
Mun et al.

(10) Patent No.: US 11,908,930 B2
(45) Date of Patent: Feb. 20, 2024

(54) LATERALLY-DIFFUSED METAL-OXIDE-SEMICONDUCTOR DEVICES WITH A MULTIPLE-THICKNESS BUFFER DIELECTRIC LAYER

(71) Applicant: GLOBALFOUNDRIES Singapore Pte. Ltd., Singapore (SG)

(72) Inventors: Namchil Mun, Singapore (SG); Shiang Yang Ong, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 360 days.

(21) Appl. No.: 17/404,165

(22) Filed: Aug. 17, 2021

(65) Prior Publication Data

US 2023/0059226 A1    Feb. 23, 2023

(51) Int. Cl.
    *H01L 29/78*       (2006.01)
    *H01L 29/06*       (2006.01)
              (Continued)

(52) U.S. Cl.
    CPC .... *H01L 29/7816* (2013.01); *H01L 21/02236* (2013.01); *H01L 21/02255* (2013.01);
              (Continued)

(58) Field of Classification Search
    CPC ......... H01L 21/02236; H01L 21/02255; H01L 21/266; H01L 21/76202; H01L 21/76224;
              (Continued)

(56) References Cited

U.S. PATENT DOCUMENTS 8,710,587 B2    4/2014   Moon et al.
9,853,121 B2   12/2017   Lin et al.
(Continued)

FOREIGN PATENT DOCUMENTS

CN          103531619 A1    1/2014
KR   10-2009-0122136 A    11/2009
(Continued)

OTHER PUBLICATIONS

Taiwan Intellectual Property Office; Office Action and Search Report issued in Taiwanese Patent Application No. 111126802 dated Aug. 4, 2023; 7 pages.
(Continued)

*Primary Examiner* — Fazli Erdem
(74) *Attorney, Agent, or Firm* — Thompson Hine LLP; Francois Pagette

(57) ABSTRACT

Structures for a laterally-diffused metal-oxide-semiconductor device and methods of forming a structure for a laterally-diffused metal-oxide-semiconductor device. The structure includes a drift well in a semiconductor substrate, source and drain regions in the semiconductor substrate, a gate dielectric layer on the semiconductor substrate, and a buffer dielectric layer on the semiconductor substrate over the drift well. The buffer dielectric layer includes a first side edge adjacent to the drain region, a second side edge adjacent to the gate dielectric layer, a first section extending from the second side edge to the first side edge, and a plurality of second sections extending from the second side edge toward the first side edge. The first section has a first thickness, and the second sections have a second thickness less than the first thickness. A gate electrode includes respective portions that overlap with the buffer dielectric layer and with the gate dielectric layer.

20 Claims, 20 Drawing Sheets

(51) Int. Cl.
*H01L 29/10* (2006.01)
*H01L 29/66* (2006.01)
*H01L 21/02* (2006.01)
*H01L 21/762* (2006.01)

(52) U.S. Cl.
CPC ...... *H01L 21/76202* (2013.01); *H01L 29/063* (2013.01); *H01L 29/0649* (2013.01); *H01L 29/1095* (2013.01); *H01L 29/66681* (2013.01)

(58) Field of Classification Search
CPC ........... H01L 21/76283; H01L 29/0649; H01L 29/0653; H01L 29/0696; H01L 29/063; H01L 29/1095; H01L 29/66681; H01L 29/7816
See application file for complete search history.

(56) References Cited

U.S. PATENT DOCUMENTS

| | | | |
|---|---|---|---|
| 10,211,335 B2 | 2/2019 | Pendharkar et al. | |
| 2009/0289312 A1 | 11/2009 | Mori | |
| 2012/0292698 A1* | 11/2012 | Moon | H01L 29/7816 |
| | | | 438/286 |
| 2015/0137232 A1 | 5/2015 | Huang et al. | |
| 2018/0175191 A1 | 6/2018 | Pendharkar et al. | |
| 2019/0348533 A1 | 11/2019 | Huang | |
| 2019/0371896 A1* | 12/2019 | Wang | H01L 29/42368 |
| 2019/0386138 A1* | 12/2019 | Zhang | H01L 21/823462 |
| 2022/0085211 A1* | 3/2022 | Mun | H01L 29/6656 |

FOREIGN PATENT DOCUMENTS

| | | |
|---|---|---|
| KR | 10-2012-0127945 A | 11/2012 |
| TW | 201947761 A | 12/2019 |

OTHER PUBLICATIONS

Korean Intellectual Property Office; Notice of Preliminary Rejection issued in Korean Patent Application No. 10-2022-0082217 dated Oct. 17, 2023; 6 pages.

\* cited by examiner

US 11,908,930 B2

LATERALLY-DIFFUSED METAL-OXIDE-SEMICONDUCTOR DEVICES WITH A MULTIPLE-THICKNESS BUFFER DIELECTRIC LAYER

BACKGROUND

The invention relates generally to semiconductor devices and integrated circuit fabrication and, more specifically, to structures for a laterally-diffused metal-oxide-semiconductor device and methods of forming a structure for a laterally-diffused metal-oxide-semiconductor device.

High-voltage integrated circuits used, for example, in microwave/RF power amplifiers typically require specialized circuit technology capable of withstanding higher voltages. Laterally-diffused metal-oxide-semiconductor (LDMOS) devices, also known as extended-drain metal-oxide-semiconductor (EDMOS) devices, are designed to handle such higher voltages by incorporating additional transistor features, such as a drift well providing an extended drain, that promote the higher voltage handling capability. Laterally-diffused metal-oxide-semiconductor devices may be used, for example, for high-voltage power switching.

Reduced surface field (RESURF) techniques may be utilized to provide laterally-diffused metal-oxide-semiconductor devices with a low specific on-resistance and a high breakdown voltage. Laterally-diffused metal-oxide-semiconductor devices may include a thick field oxide layer embedded in the drift well between the source and drain. The field oxide layer must be formed with a thickness that reflects the intended operating voltage. The thickness of the field oxide layer is increased commensurate with the intended operating voltage. A top layer may be formed as an oppositely-doped region in the drift well beneath the field oxide layer in order to decrease the specific on-resistance while maintaining a high breakdown voltage. Current flowing between the source and drain must navigate in the drift well around the field oxide layer and the top layer, which may result in current crowding proximate to the corners of the field oxide layer and the top layer.

Improved structures for a laterally-diffused metal-oxide-semiconductor device and methods of forming a structure for a laterally-diffused metal-oxide-semiconductor device are needed.

SUMMARY

In an embodiment, a structure for a laterally-diffused metal-oxide-semiconductor device is provided. The structure includes a semiconductor substrate, a drift well in the semiconductor substrate, a source region and a drain region in the semiconductor substrate, a gate dielectric layer on the semiconductor substrate, and a buffer dielectric layer on the semiconductor substrate over the drift well. The buffer dielectric layer includes a first side edge adjacent to the drain region, a second side edge adjacent to the gate dielectric layer, a first section extending from the second side edge to the first side edge, and a plurality of second sections extending from the second side edge toward the first side edge. The first section has a first thickness, and each of the second sections has a second thickness less than the first thickness. The structure further includes a gate electrode laterally positioned between the source region and the drain region. The gate electrode includes a first portion that overlaps with the buffer dielectric layer and a second portion that overlaps with the gate dielectric layer.

In an embodiment, a method of forming a structure for a laterally-diffused metal-oxide-semiconductor device is provided. The method includes forming a drift well in a semiconductor substrate, forming a source region and a drain region in the semiconductor substrate, forming a gate dielectric layer on the semiconductor substrate, and forming a buffer dielectric layer on the semiconductor substrate over the drift well. The buffer dielectric layer includes a first side edge adjacent to the drain region, a second side edge adjacent to the gate dielectric layer, a first section extending from the second side edge to the first side edge, and a plurality of second sections extending from the second side edge toward the first side edge. The first section has a first thickness, and each of the second sections has a second thickness less than the first thickness. The method further includes forming a gate electrode laterally positioned between the source region and the drain region. The gate electrode includes a first portion that overlaps with the buffer dielectric layer and a second portion that overlaps with the gate dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
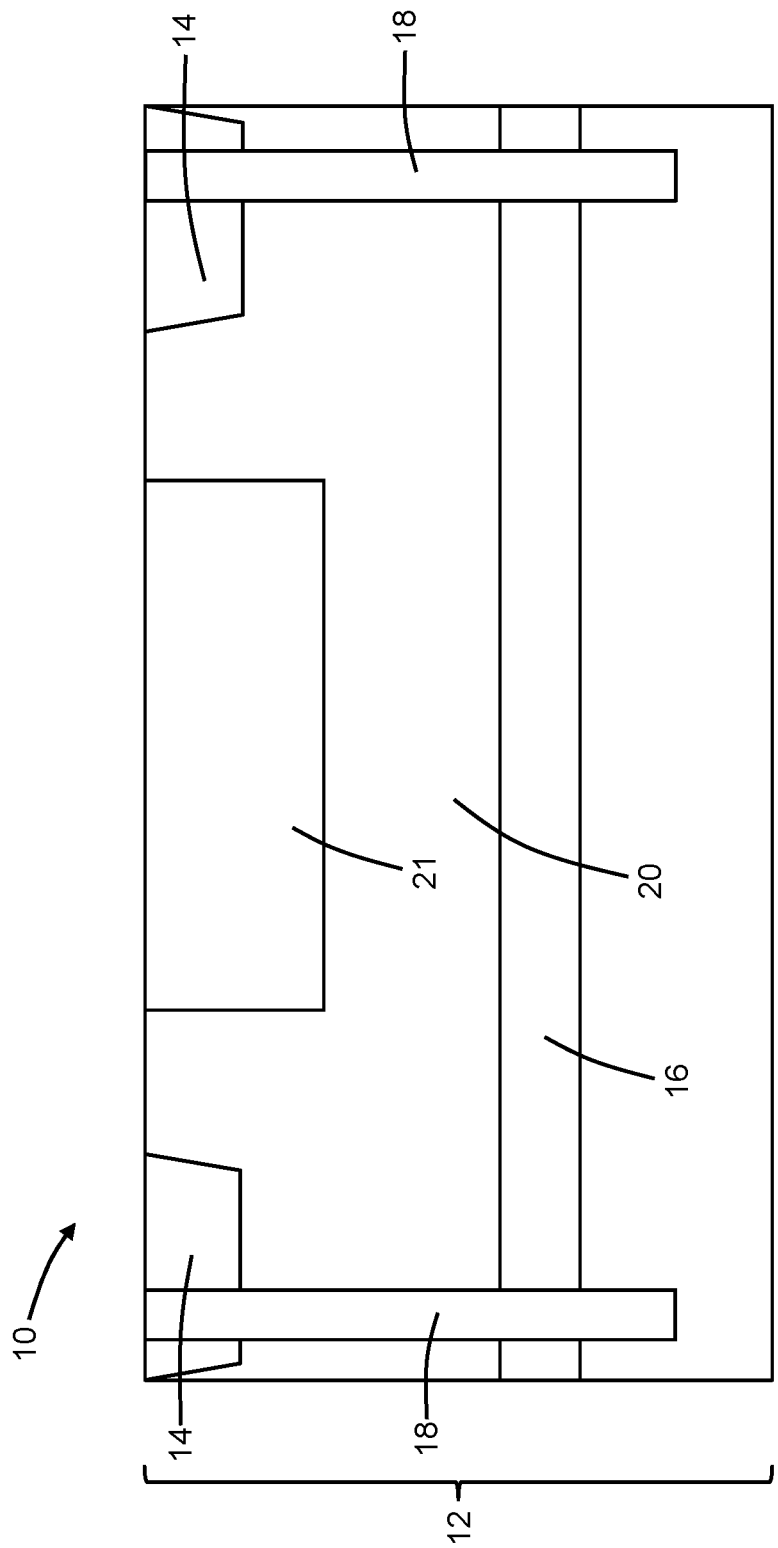
FIG. 1 is a cross-sectional view of a structure at an initial fabrication stage of a processing method in accordance with embodiments of the invention.

With reference to FIG. 1 and in accordance with embodiments of the invention, a structure 10 for a laterally-diffused metal-oxide-semiconductor device includes a substrate 12 and a shallow trench isolation region 14 that is arranged in the substrate 12 to surround an active device region. The substrate 12 may be comprised of a semiconductor material, such as single-crystal silicon. In an embodiment, the substrate 12 may be lightly doped to have p-type conductivity. The substrate 12 may include an epitaxial layer of semiconductor material epitaxially grown with a given thickness proximate to the top surface. The shallow trench isolation region 14 may be formed by patterning shallow trenches in the substrate 12 with lithography and etching processes, depositing a dielectric material to fill the shallow trenches, and planarizing and/or recessing the deposited dielectric material. The dielectric material of the shallow trench isolation region 14 may comprise silicon dioxide deposited by chemical vapor deposition.

A buried isolation layer 16 is formed over a given depth range beneath the top surface of the substrate 12. The buried isolation layer 16 may be formed in the substrate 12 by blanket ion implantation or, alternatively, may be formed by in situ doping during epitaxial growth of the semiconductor material of the epitaxial layer included in the substrate 12. The buried isolation layer 16 is doped to have an opposite conductivity type from the substrate 12. In an embodiment in which the substrate 12 is p-type doped, the buried isolation layer 16 may contain an n-type dopant, such as arsenic or phosphorus, and may be heavily doped with the n-type dopant.

A deep trench isolation region 18 is formed in a deep trench that penetrates through the shallow trench isolation region 14 and the substrate 12 between the shallow trench isolation region 14 and the buried isolation layer 16 to a shallow depth into the substrate 12 beneath the buried isolation layer 16. Similar to the shallow trench isolation region 14, the deep trench isolation region 18 may surround the active device region. The deep trench isolation region 18 may cooperate with the buried isolation layer 16 to electrically isolate the active device region from the remainder of the substrate 12. The deep trench isolation region 18 may include a dielectric collar (e.g., silicon dioxide) that lines the sidewalls of the deep trench and an electrically-conductive core (e.g., doped polysilicon or a metal). The electrically-conductive core is coupled to the substrate 12 beneath the buried isolation layer 16 and isolated from the substrate 12 above the buried isolation layer 16 by the dielectric collar.

A well 20 is formed over a given depth range above the buried isolation layer 16. The well 20 may be formed by introducing a dopant by, for example, blanket ion implantation with given implantation conditions into the substrate 12. The implantation conditions (e.g., ion species, dose, kinetic energy) may be selected to tune the electrical and physical characteristics of the well 20. The well 20 may be comprised of semiconductor material of the substrate 12 that is doped to have an opposite conductivity type from the conductivity type of the substrate 12 and the same conductivity type as the buried isolation layer 16 but at a lower dopant concentration. In an embodiment in which the substrate 12 is p-type doped, the well 20 may contain semiconductor material that is doped with an n-type dopant (e.g., phosphorus and/or arsenic) to provide n-type conductivity. The well 20 may provide a high-voltage well in the completed device structure 10.

A drift well 21 is formed in a portion of the active device region above the buried isolation layer 16 and well 20. The drift well 21 may be formed by introducing a dopant by, for example, ion implantation with given implantation conditions into the substrate 12. A patterned implantation mask may be formed to define a selected area (e.g., location and horizontal dimensions) on the top surface of the substrate 12 that is exposed for implantation to form the drift well 21. The implantation mask may include a layer of a material, such as an organic photoresist, having a thickness and stopping power sufficient to block implantation of the masked areas. The implantation conditions (e.g., ion species, dose, kinetic energy) may be selected to tune the electrical and physical characteristics of the drift well 21. The drift well 21 may be comprised of semiconductor material of the substrate 12 that is doped to have an opposite conductivity type from the well 20. In an embodiment in which the well 20 has n-type conductivity, the drift well 21 may contain semiconductor material that is lightly-doped with a p-type dopant (e.g., boron) to provide p-type conductivity. The drift well 21 may provide a drift region for the extended drain in the completed structure 10.

With reference to FIGS. 2, 3, 3A, 3B in which like reference numerals refer to like features in FIG. 1 and at a subsequent fabrication stage, a hardmask 22 is formed over the substrate 12. The hardmask 22 may include a pad layer comprised of a dielectric material, such as silicon nitride, and may be patterned by lithography and etching processes to provide a patterned shape. In that regard, the hardmask 22 may be patterned using an etch mask formed by lithography. The etch mask may include a layer of a light-sensitive material, such as a photoresist, applied by a spin-coating process, pre-baked, exposed to light projected through a photomask, baked after exposure, and developed with a chemical developer to define open areas with the shapes to be formed in the hardmask 22. An etching process, such as a reactive ion etching process, may then be used to remove portions of the pad layer exposed by the openings in the etch mask, which is subsequently stripped, to define openings 28 in the hardmask 22.

Each opening 28 in the hardmask 22 has a series of notches 24 that are arranged along one side edge. The notches 24 alternate along the side edge of each opening 28 with portions of the hardmask 22 that define projections 26. Each projection 26 is positioned as a finger between an adjacent pair of the notches 24 such that a comb shape is defined. The other side edges of each opening 28 in the hardmask 22 are not notched and, therefore, may be smooth. The notches 24 and projections 26 have dimensions that are selected by design rules used an input to the lithography process. Specifically, the notches 24 have a width W1, the projections 26 have a width W2 that establishes a spacing between adjacent notches 24, and the notches 24 have a depth or length L1. The numerical values of the width W1, width W2, and length L1 may be used to determine the thickness variation of a subsequently-formed oxide layer.

In an embodiment, the distribution of the notches 24 and projections 26 may be uniform along the side edge of each opening 28. In the representative embodiment, the notches 24 and the projections 26 may be rectangular. In an alternative embodiment, the notches 24 and the projections 26 may be trapezoidal. In an alternative embodiment, the notches 24 may have a pointed shape and the projections 26 may be trapezoidal.

Doped regions 34 may be formed in the drift well 21 as top layers by, for example, ion implantation with the hardmask 22 serving as an implantation mask. As a result, the doped regions 34 are formed inside the openings 28 in the hardmask 22, which determine the implanted areas of the substrate 12. The hardmask 22 blocks implantation of areas of the substrate 12 surrounding the openings 28. The implantation conditions (e.g., ion species, dose, kinetic energy)

may be selected to tune the electrical and physical characteristics of the doped regions 34. The doped regions 34 are doped to have an opposite conductivity type from the drift well 21. In an embodiment in which the drift well 21 contains a p-type dopant, the semiconductor material of the doped regions 34 may contain an n-type dopant (e.g., arsenic and/or phosphorus) that provides n-type electrical conductivity.

The implanted area for each doped region 34 matches the open area of the corresponding opening 28 and exhibits shape variations identical to the shape variations imparted by the notches 24 and projections 26. In that regard, the doped regions 34 that extend in the substrate 12 beneath the notches 24 of the openings 28 have a length L2, and the doped regions 34 at the locations of the projections 26 have a length L3 that is less than the length L2.

With reference to FIGS. 4, 5, 5A, 5B in which like reference numerals refer to like features in FIGS. 2, 3, 3A, 3B and at a subsequent fabrication stage, buffer dielectric layers 30 are formed leveraging the openings 28 in the hardmask 22, and the hardmask 22 is removed subsequent to the formation of the buffer dielectric layers 30. In an embodiment, the buffer dielectric layers 30 may be comprised of silicon dioxide. In an embodiment, the buffer dielectric layers 30 may be formed as a field oxide by subjecting the substrate 12 to thermal oxidation in an oxidizing atmosphere (e.g., an atmosphere with an oxygen content) using a local oxidation of silicon (LOCOS) process. The oxidizing species (e.g., oxygen) is barred from diffusing through the thickness of the hardmask 22 during thermal oxidation, and the openings 28 in the hardmask 22 define exposed or unprotected areas that are thermally oxidized to grow the buffer dielectric layers 30. Each buffer dielectric layer 30 may grow beneath the projections 26 in the hardmask 22 and adjacent to the other edges of the respective openings 28 due to lateral diffusion of the oxidizing species in the substrate 12 beneath the hardmask 22. In particular, the oxidizing species laterally diffuses in the substrate 12 from the notches 24 beneath each projection 26 from each of its side edges. The oxidizing species reacts with the semiconductor material of the substrate 12 beneath the projections 26.

Each buffer dielectric layer 30 includes a side edge 32, a side edge 33 opposite to the side edge 32, a section 60 having a thickness T1, sections 62 having a thickness T2, and sections 64 that provide a thickness transition between the section 60 and the sections 62. The sections 60 of the buffer dielectric layers 30 may form inside the openings 28 in the hardmask 22, including inside the spaces defined by the notches 24. The sections 62 of buffer dielectric layers 30 may form beneath the projections 26 of the hardmask 22. The shape and dimensions of the sections 60, 62 of each buffer dielectric layer 30 are determined at least in part by the shape and dimensions of the notches 24 and projections 26.

The thickness T2 of the sections 62 is less than the thickness T1 of the section 60. In an embodiment, the thickness T1 of the section 60 of each buffer dielectric layer 30 may be uniform. In an embodiment, the thickness T2 of the sections 62 of each buffer dielectric layer 30 may be uniform. In an embodiment, the thickness T1 of the section 60 of each buffer dielectric layer 30 may be substantially uniform. In an embodiment, the thickness T2 of the sections 62 of each buffer dielectric layer 30 may be substantially uniform.

The sections 64 of each buffer dielectric layer 30 taper over a range of intermediate thicknesses from the thickness T1 at the intersection with the section 60 to the thickness T2 at the intersection with each section 62. The sections 64 are formed proximate to the side edges of the projections 26 of the hardmask 22. Each section 64 extends about multiple sides of each section 62.

The sections 60, 62 of each buffer dielectric layer 30 also include peripheral sections 66 representing bird's beaks for which the dielectric material tapers to a zero thickness. The side edges 32, 33 of each buffer dielectric layer 30 are defined at the corners between the section 60 and the peripheral sections 66.

The doped regions 34 are self-aligned to the section 60 of each buffer dielectric layer 30 because they are formed using the same patterned hardmask 22. That is, the doped regions 34 are only positioned beneath the sections 60 of the buffer dielectric layers 30 such that a comb shape is defined. In an embodiment, the doped regions 34 may be coextensive with (i.e., share a boundary with) the sections 60 of the buffer dielectric layers 30. The doped regions 34 are not positioned beneath the sections 62 of the buffer dielectric layers 30. Instead, portions of the drift well 21 are positioned beneath the sections 62 of the buffer dielectric layers 30. In an embodiment, the portions of the drift well 21 may be coextensive with the sections 62 of the buffer dielectric layers 30.

Figure 5:
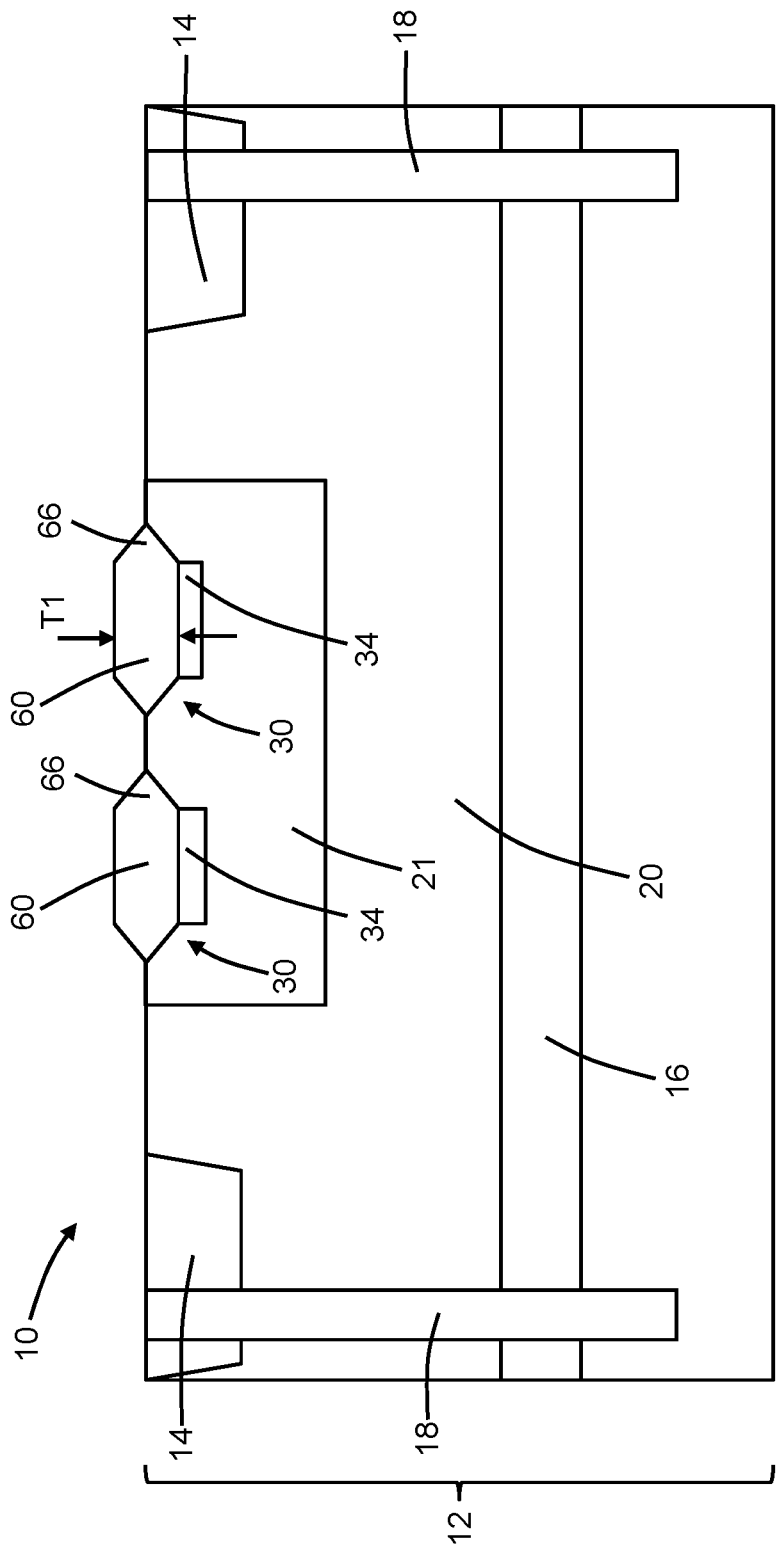
FIG. 5 is a cross-sectional view taken generally along line 5-5 in FIG. 4.
Figure 5A:
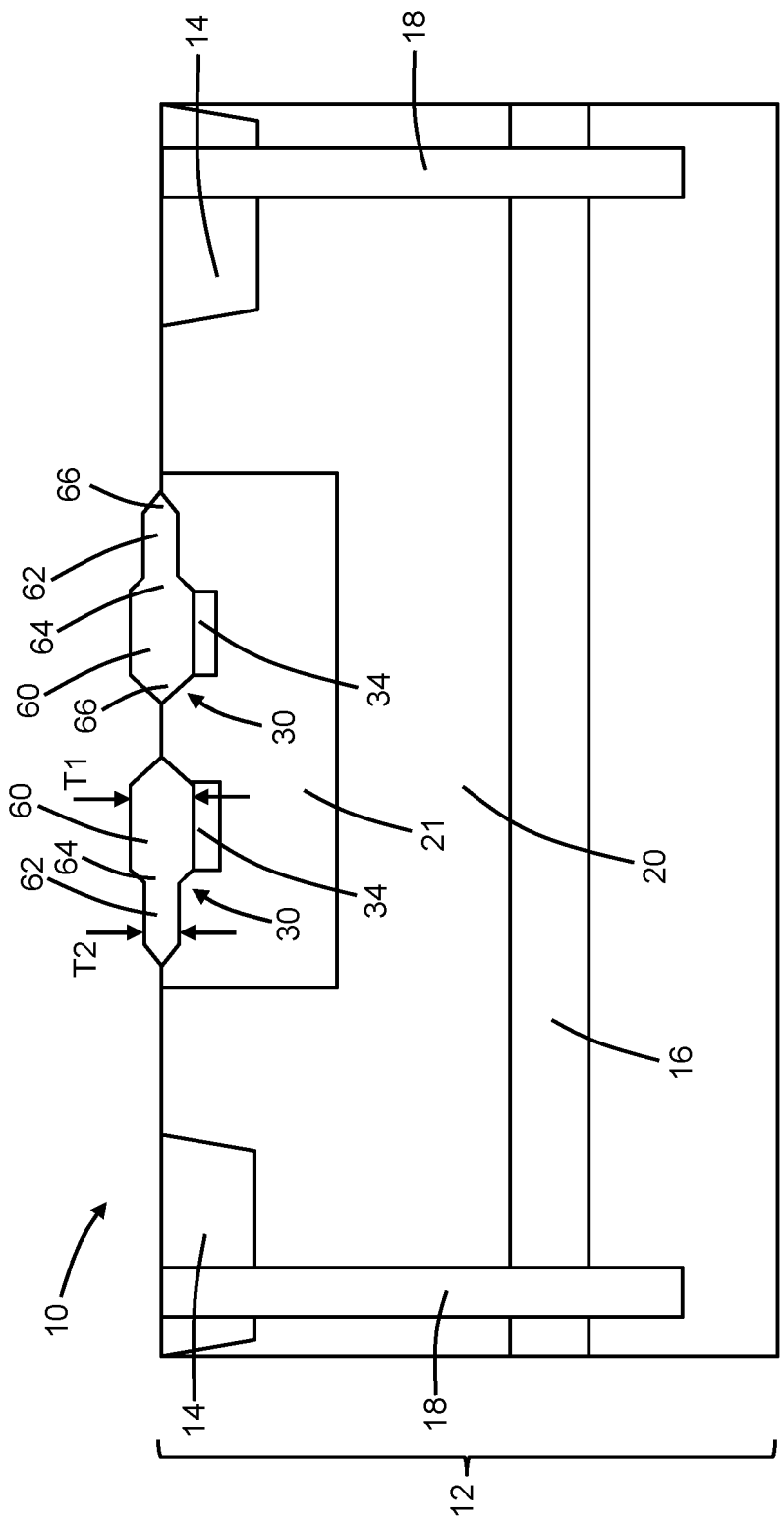
FIG. 5A is a cross-sectional view taken generally along line 5A-5A in FIG. 4.
Figure 5B:
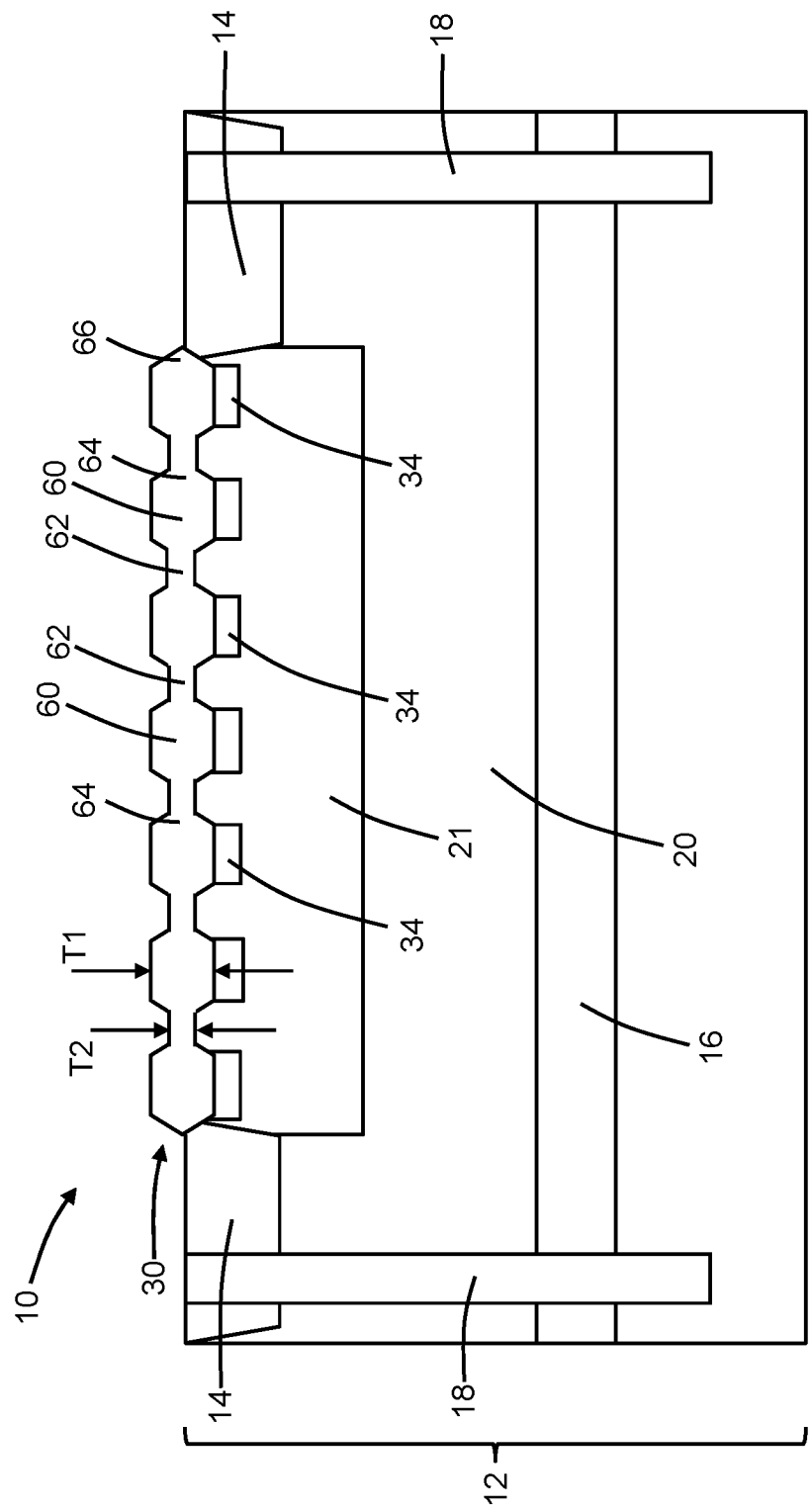
FIG. 5B is a cross-sectional view taken generally along line 5B-5B in FIG. 4.
Figure 6:
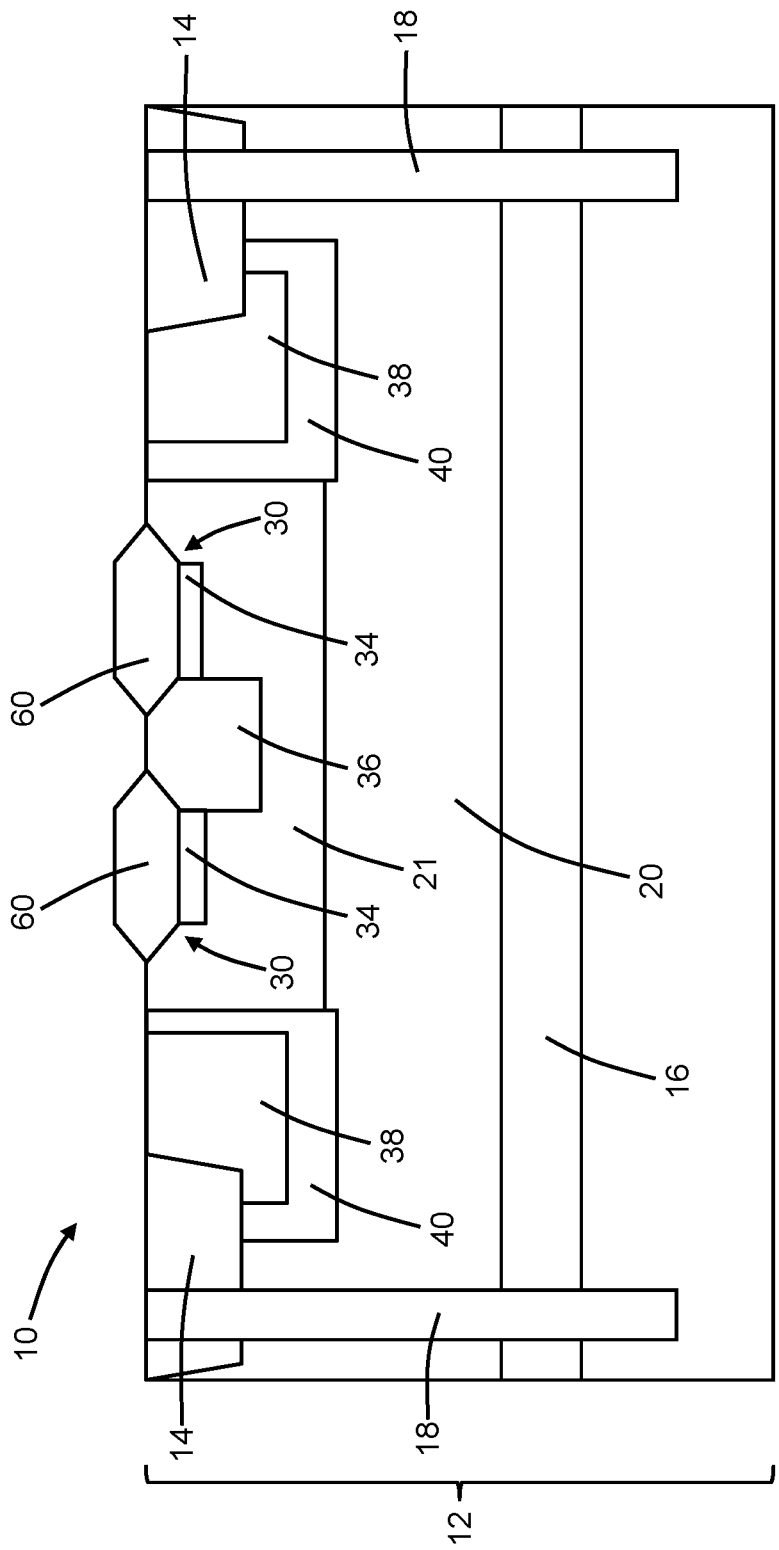
FIGS. 6, 6A, 6B are cross-sectional views of the structure at a fabrication stage subsequent to FIGS. 5, 5A, 5B.
Figure 6A:
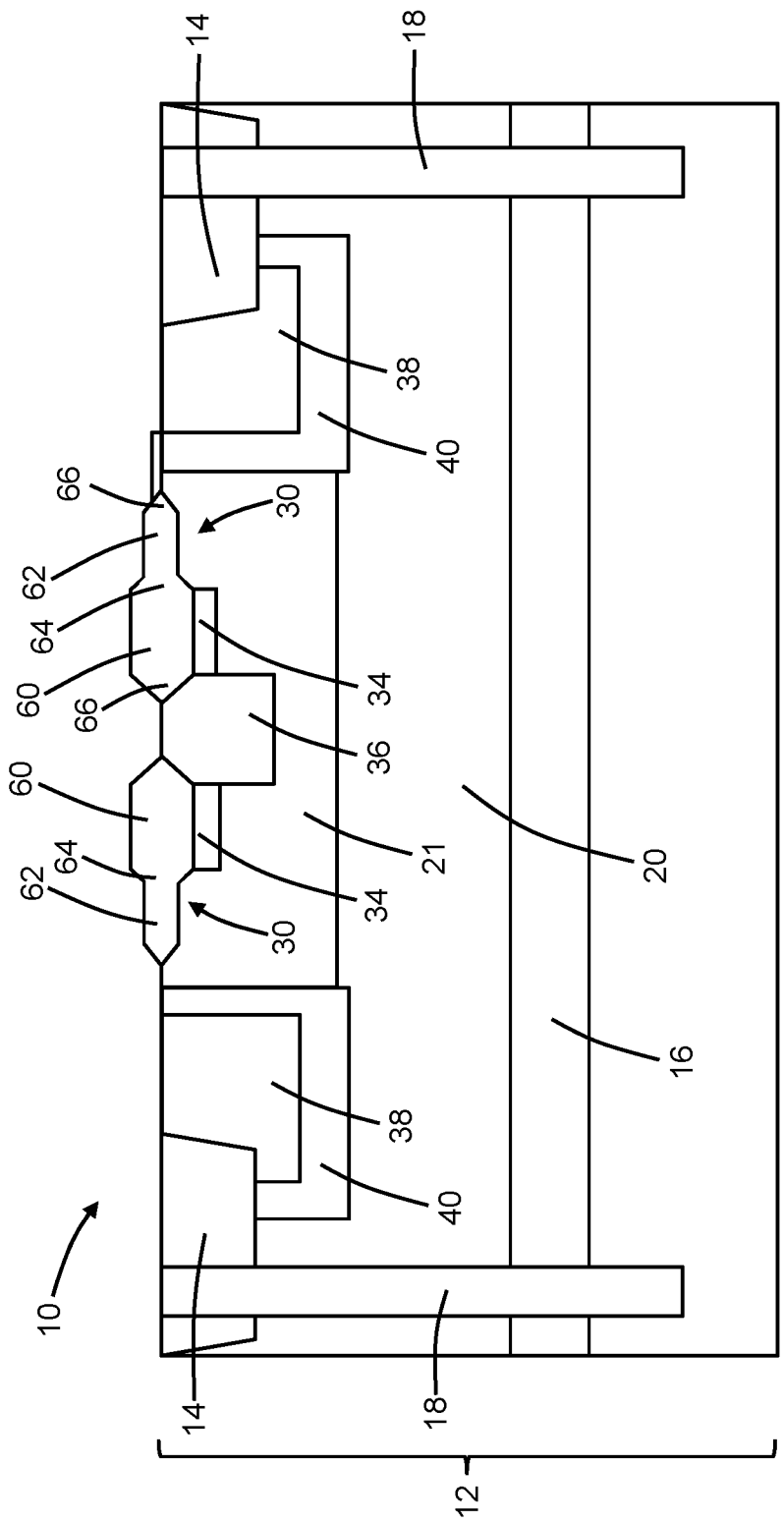
Figure 6B:
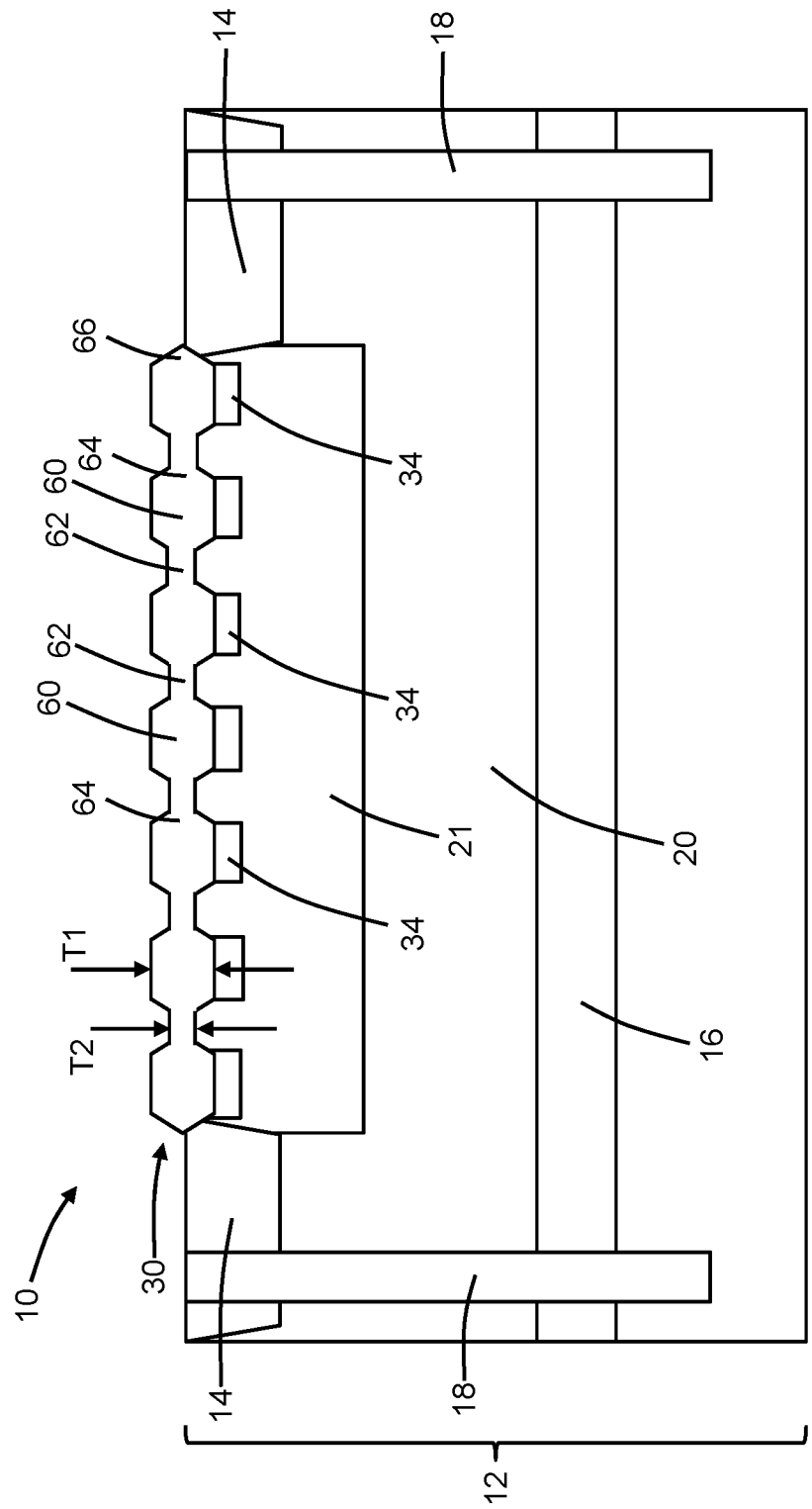

With reference to FIGS. 6, 6A, 6B in which like reference numerals refer to like features in FIGS. 5, 5A, 5B and at a subsequent fabrication stage, wells 36, 38, 40 are formed in the active region of the substrate 12. The wells 38, 40 are comprised of semiconductor material of the substrate 12 that is doped to have a given conductivity type. The well 36 is comprised of semiconductor material of the substrate 12 that is doped to have an opposite conductivity type from the wells 38, 40. The well 36 may be formed by introducing a dopant by, for example, ion implantation with given implantation conditions into the substrate 12. The wells 38 and the wells 40 may be formed by introducing a different dopant of opposite conductivity type by, for example, ion implantation into the substrate 12. A patterned implantation mask may be formed to define a selected area or areas on the top surface of the substrate 12 that is exposed for each individual implantation. The implantation masks cover different areas on the top surface of the substrate 12 in order to determine, at least in part, the location and horizontal dimensions of the wells 36, 38, 40. Each implantation mask may include a layer of a material, such as an organic photoresist, that is applied and patterned such that the different areas on the top surface of the substrate 12 are covered and masked. Each implantation mask has a thickness and stopping power sufficient to block implantation of the masked areas.

The implantation conditions (e.g., ion species, dose, kinetic energy) may be selected to tune the electrical and physical characteristics of the well 36. A separate set of implantation conditions (e.g., ion species, dose, kinetic energy) may be selected to tune the electrical and physical characteristics of the wells 38. A separate set of implantation conditions (e.g., ion species, dose, kinetic energy) may be selected to tune the electrical and physical characteristics of the wells 40. The wells 40 may encompass the wells 38 and may have a lower dopant concentration than the wells 38. In an embodiment in which the well 20 has n-type conductivity and the drift well 21 has p-type conductivity, the well 36 may contain semiconductor material doped with a p-type dopant (e.g., boron) to provide p-type conductivity, and the wells 38, 40 may contain semiconductor material doped with different dopant concentrations of an n-type dopant (e.g., phosphorus and/or arsenic) to provide n-type conductivity.

Figure 7:
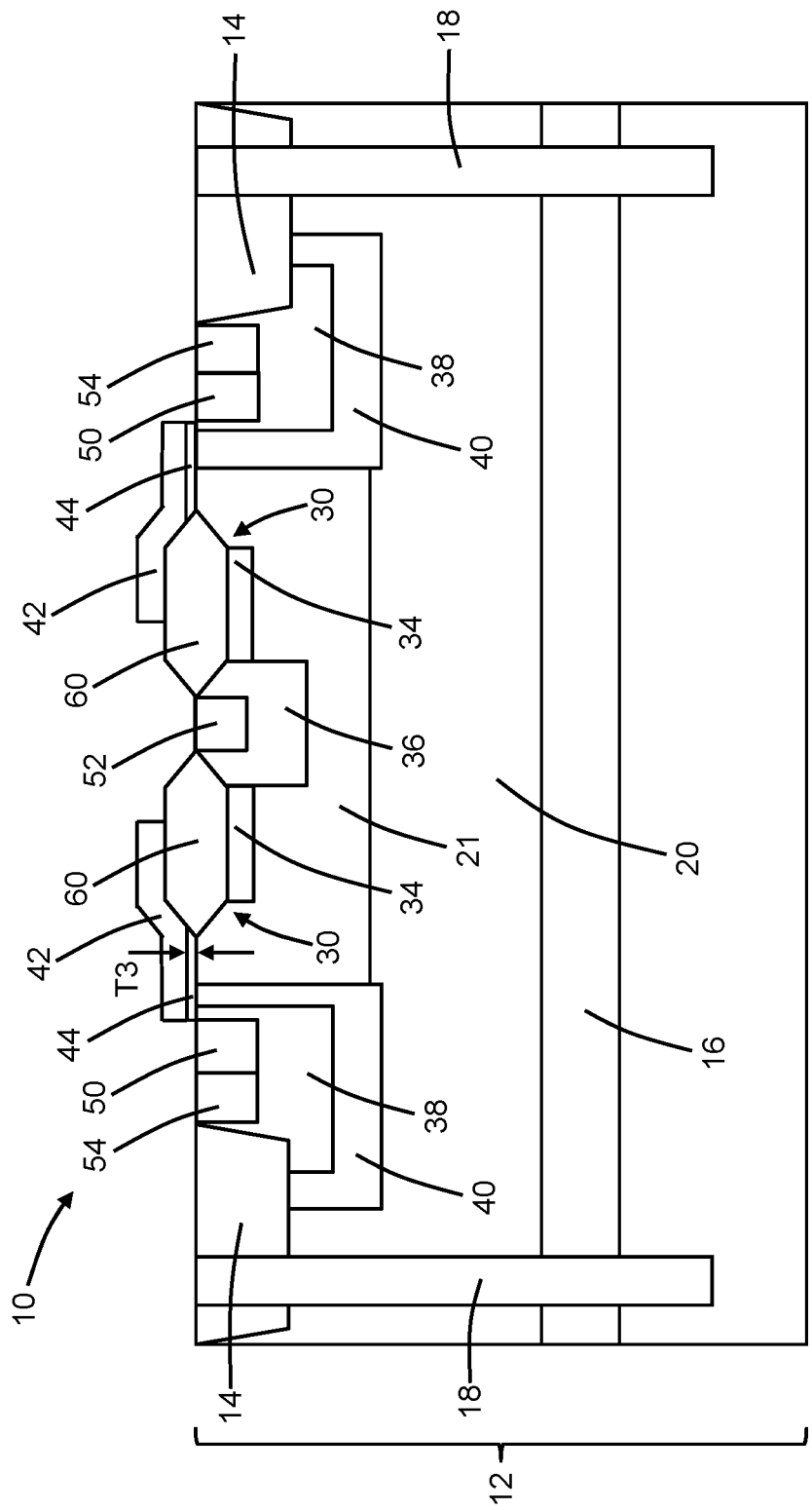
FIGS. 7, 7A, 7B are cross-sectional views of the structure at a fabrication stage subsequent to FIGS. 6, 6A, 6B.
Figure 7A:
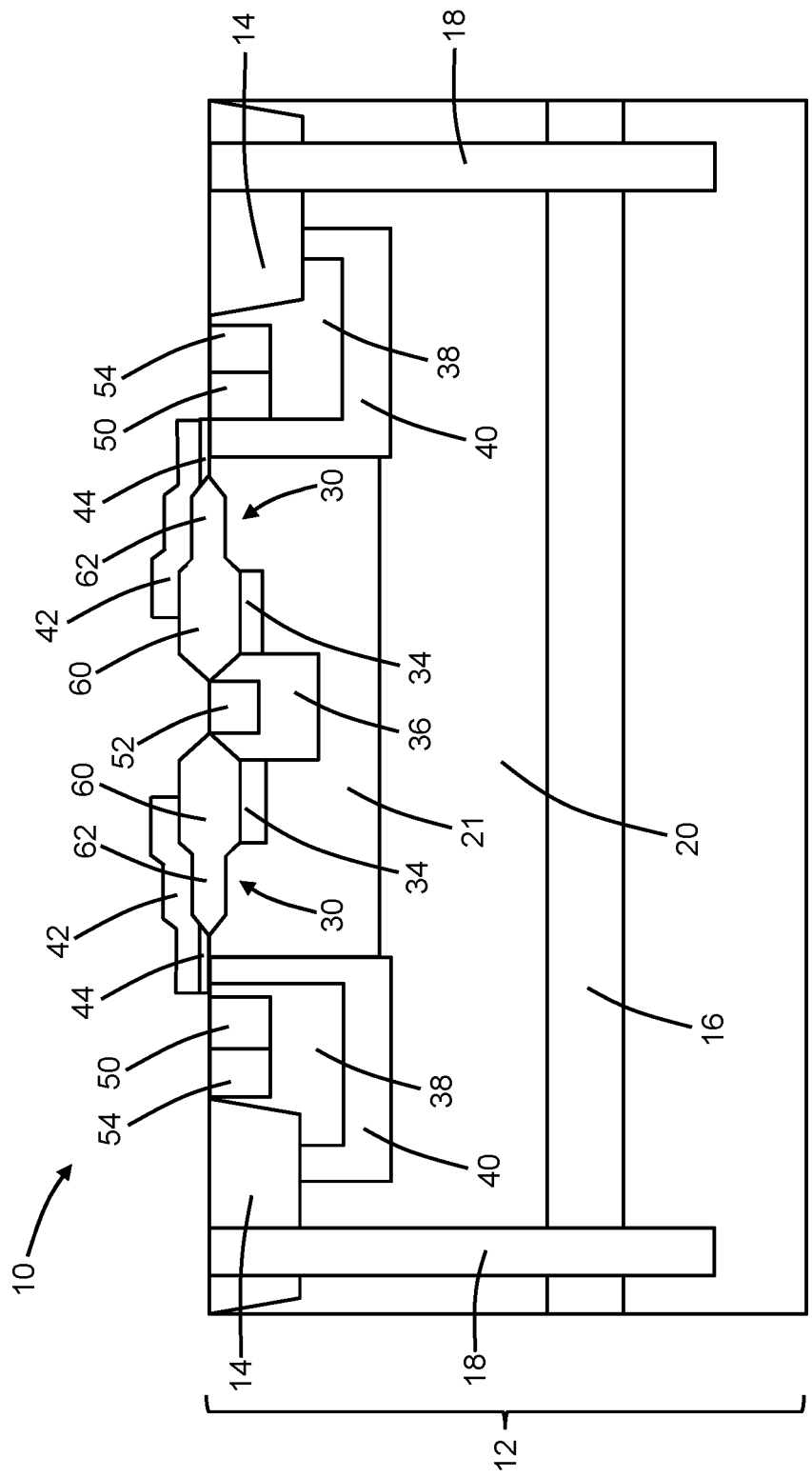
Figure 7B:
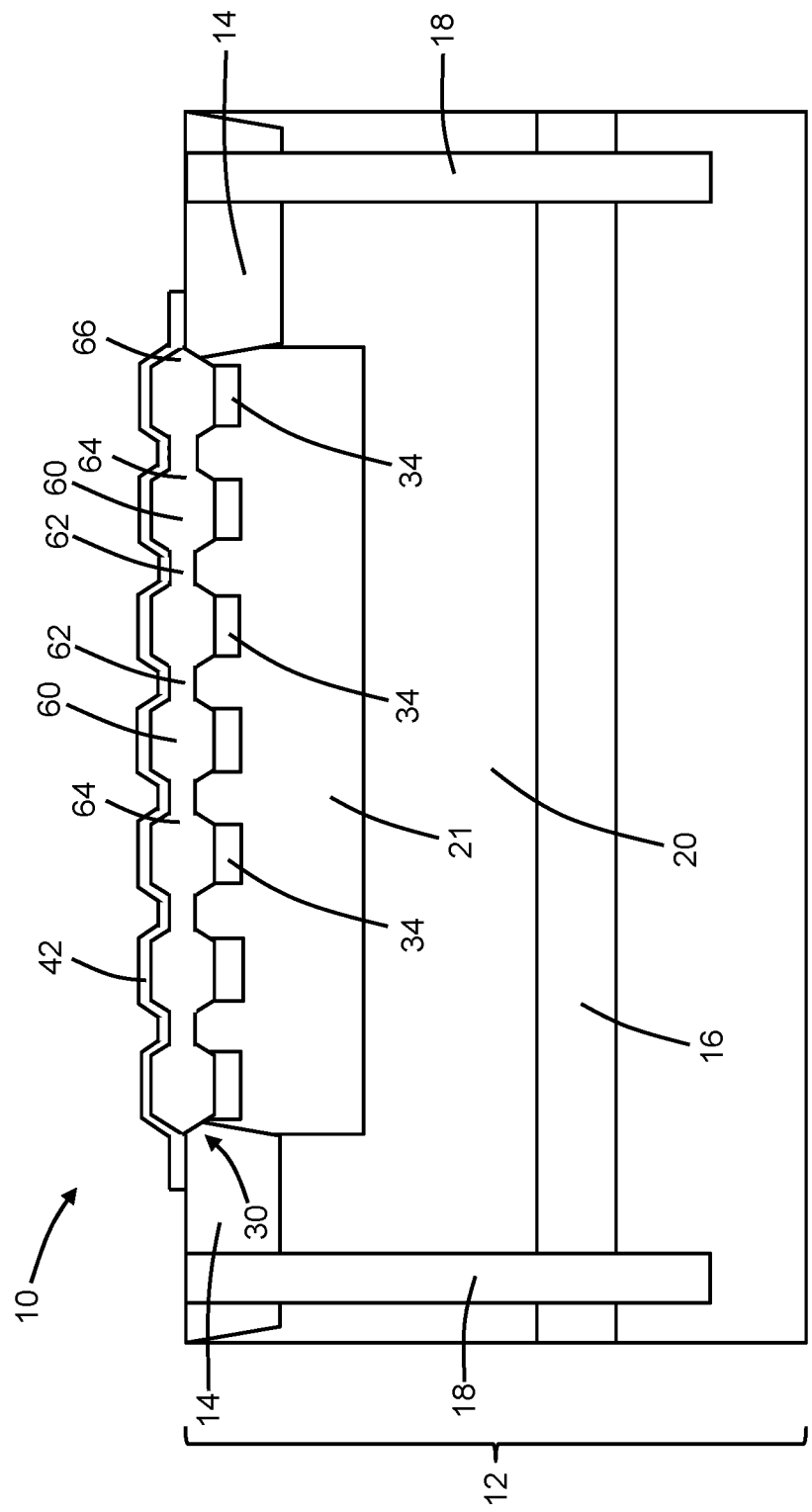

With reference to FIGS. 7, 7A, 7B in which like reference numerals refer to like features in FIGS. 6, 6A, 6B and at a subsequent fabrication stage, gate electrodes 42 and gate dielectric layers 44 defining a pair of gates are formed with a split-gate arrangement. Each gate dielectric layer 44 is comprised of a dielectric material, such as silicon dioxide formed by thermal oxidation of the semiconductor material of the substrate 12. The gate dielectric layers 44 have a thickness T3 that is less than the thickness of the section 60 of the buffer dielectric layer 30 and less than the thickness of the sections 62 of the buffer dielectric layer 30. Each gate electrode 42 is comprised of a conductor, such as doped polysilicon. The gate electrodes 42 and gate dielectric layers 44 may be formed by patterning layers of their respective materials with lithography and etching processes.

Source regions 50, a drain region 52, and body contact regions 54 for the laterally-diffused metal-oxide-semiconductor device are formed in the wells 36, 38. The source regions 50 and the drain region 52 may be doped to have an opposite conductivity type from the body contact regions 54. The source regions 50, which are disposed in the wells 38, may be doped to have an opposite conductivity type from the wells 38 and may be heavily doped. The drain region 52, which is disposed in the well 36, may be doped to have the same conductivity type as the well 36 but at a higher dopant concentration (e.g., heavily doped). The body contact regions 54, which are disposed in the wells 38 and may have an abutting relationship with the source regions 50, may be doped to have the same conductivity type as the wells 38. In an embodiment in which the well 36 has p-type conductivity and the wells 38 have n-type conductivity, the source regions 50 and the drain region 52 may be doped (e.g., heavily doped) with a p-type dopant (e.g., boron) to provide p-type conductivity, and the body contact regions 54 may be doped (e.g., heavily doped) with an n-type dopant (e.g., phosphorus and/or arsenic) to provide n-type conductivity.

The source regions 50 and the drain region 52 may be formed by selectively implanting ions, such as ions including the p-type dopant, with an implantation mask defining the intended locations for the source regions 50 and the drain region 52 in the substrate 12. The body contact regions 54 may be formed by selectively implanting ions, such as ions including the n-type dopant, with a different implantation mask defining the intended locations for the body contact regions 54 in the substrate 12.

Each gate dielectric layer 44 is located adjacent to the side edge 32 of one of the buffer dielectric layers 30 and, in an embodiment, abuts the side edge 32 of the adjacent buffer dielectric layer 30. Each gate electrode 42 includes a portion that overlaps with the gate dielectric layer 44 and another portion that overlaps with the buffer dielectric layer 30. The portion of each gate electrode 42 overlapping with the buffer dielectric layer 30 defines a field plate. In an embodiment, each gate electrode 42 fully overlaps with the sections 62 of the buffer dielectric layer 30. The section 60 of each buffer dielectric layer 30 extends from the side edge 32, which is adjacent to the gate dielectric layer 44, to the side edge 33. The sections 62 of each buffer dielectric layer 30 extend from the side edge 32 toward the side edge 33 and, therefore, only extend partially across the buffer dielectric layer 30. The side edge 33 of each buffer dielectric layer 30 is adjacent to the drain region 52.

Each grouping of buffer dielectric layer 30, gate electrode 42, and gate dielectric layers 44 is laterally positioned on the substrate 12 between the drain region 52 and one of the source regions 50. The sections 62 of each buffer dielectric layer 30, which have the reduced thickness relative to section 60, are positioned adjacent to one of the source regions 50 and remote from the drain region 52. The sections 62 of each buffer dielectric layer 30 are separated from the drain region 52 by the section 60.

Middle-of-line (MOL) processing and back-end-of-line (BEOL) processing follow, which includes formation of an interconnect structure coupled with the structure 10. In particular, one or more contacts are formed that are coupled with each gate electrode 42, one or more contacts are formed that are coupled with each source region 50, one or more contacts are formed that are coupled with the drain region 52, and one or more contacts are formed that are coupled with each body contact region 54.

The structure 10 may exhibit improved performance and versatility. The doped regions 34, which are absent beneath the sections 62 of the buffer dielectric layer 30, are shifted slightly away from the corner of the sections 62 of buffer dielectric layer 30 toward the drain region 52. The shifting of these corners away from the source regions 50 may assist with reducing current crowding at the corners. By adjusting the patterning of the hardmask 22 to tune the formation of the buffer dielectric layer 30, laterally-diffused metal-oxide-semiconductor devices may be formed that have different specific on-resistance and nominally the same device footprint.

Figure 2:
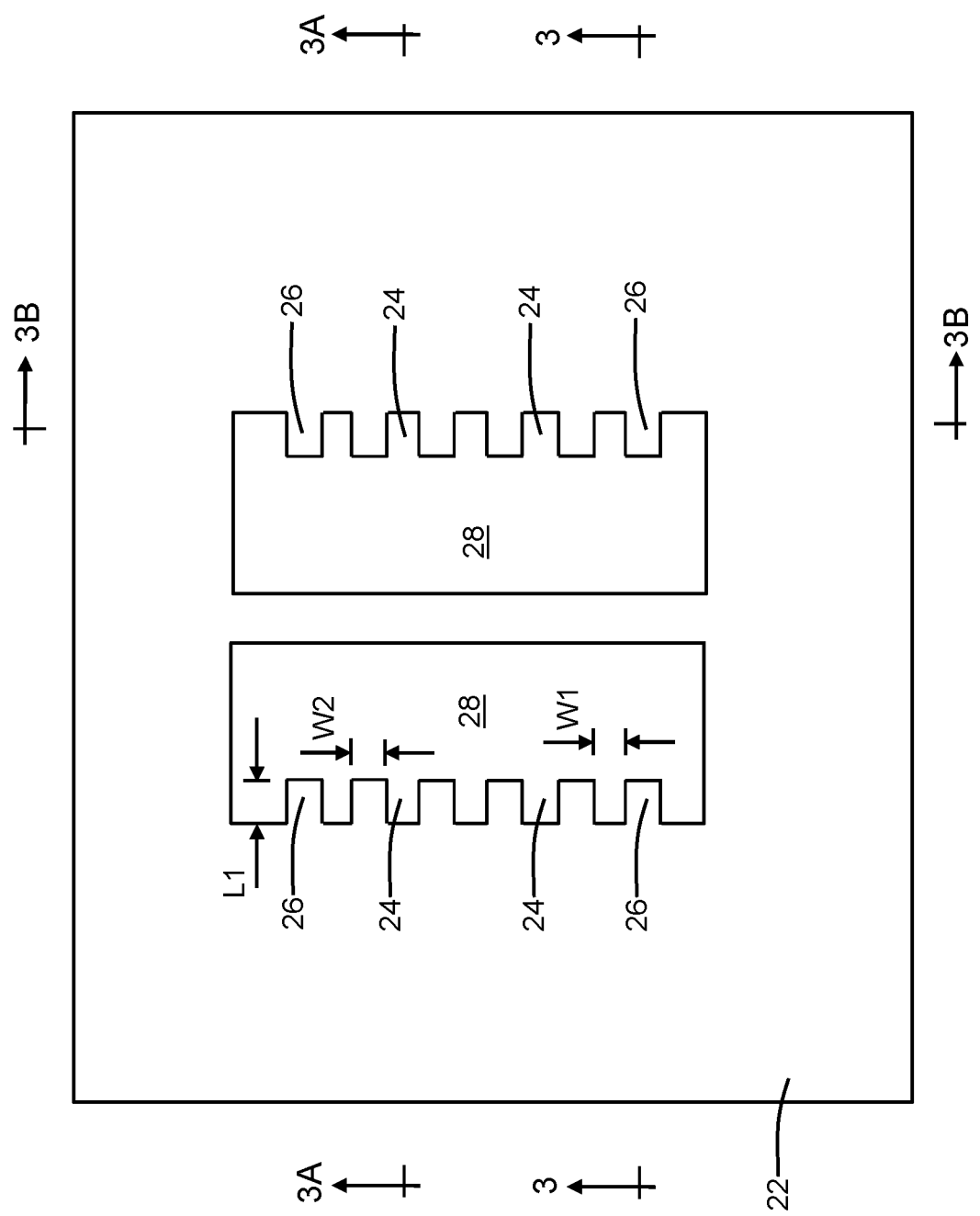
FIG. 2 is a top view of the structure at a fabrication stage subsequent to FIG. 1.
Figure 3:
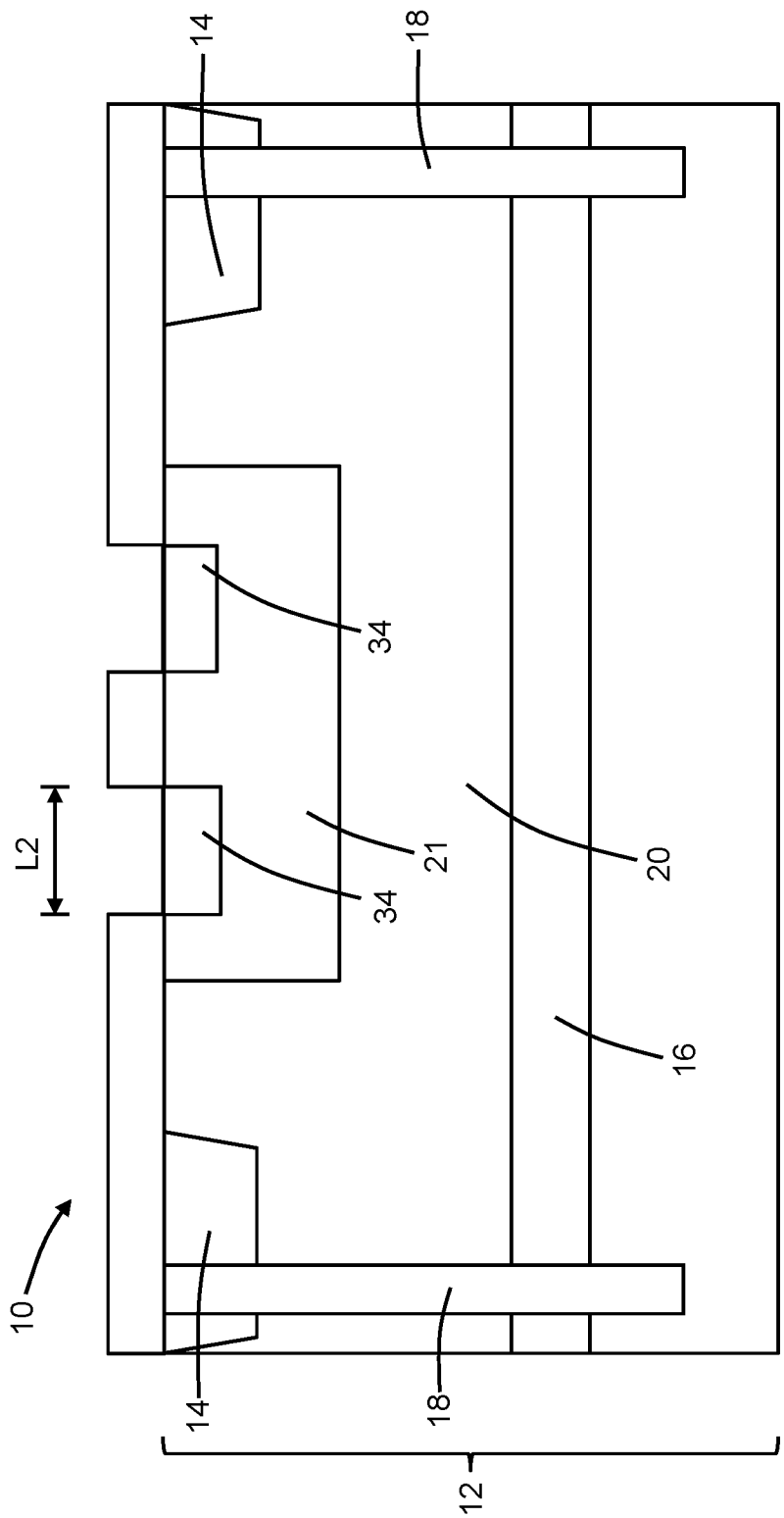
FIG. 3 is a cross-sectional view taken generally along line 3-3 in FIG. 2.
Figure 3A:
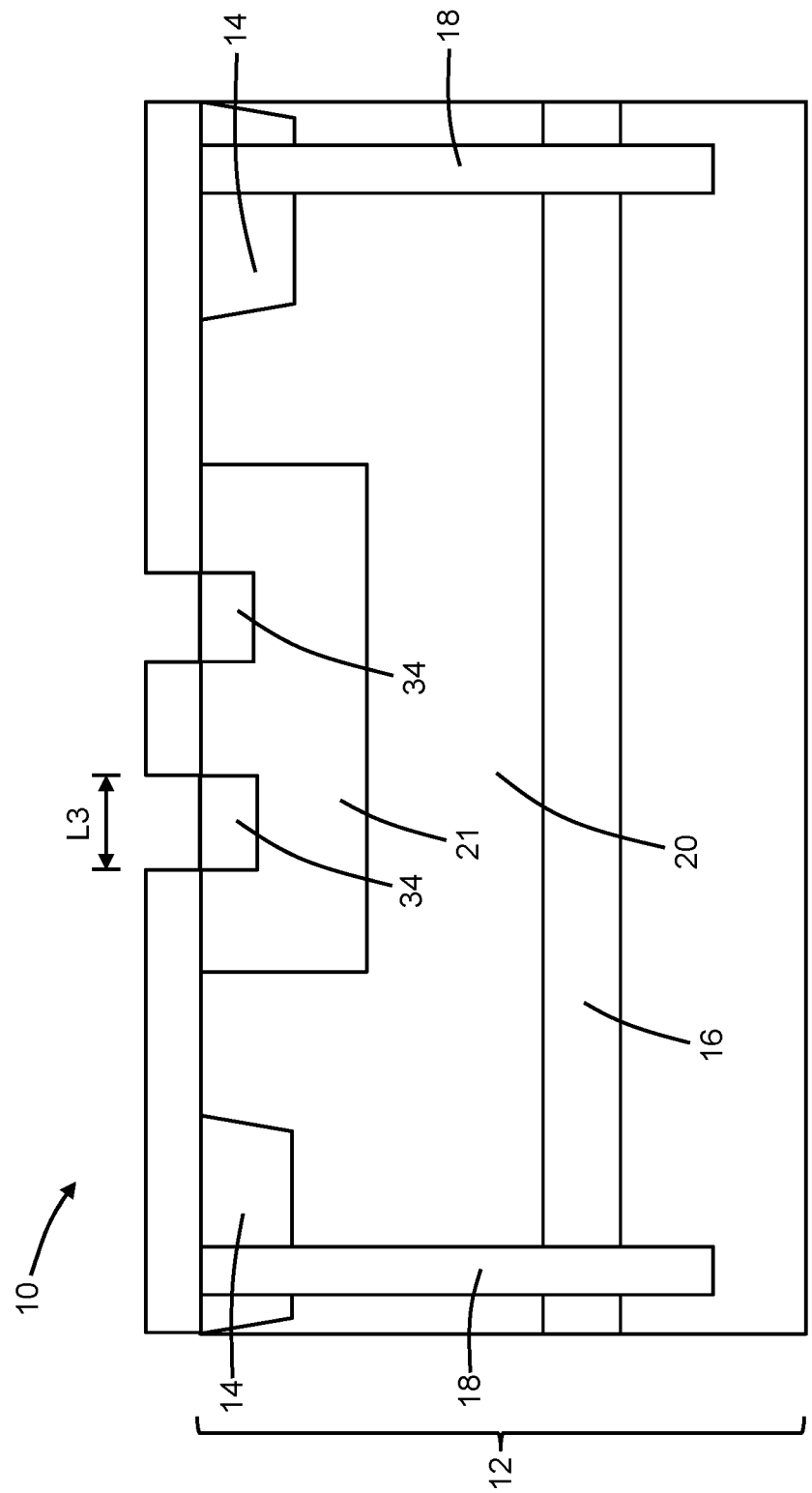
FIG. 3A is a cross-sectional view taken generally along line 3A-3A in FIG. 2.
Figure 3B:
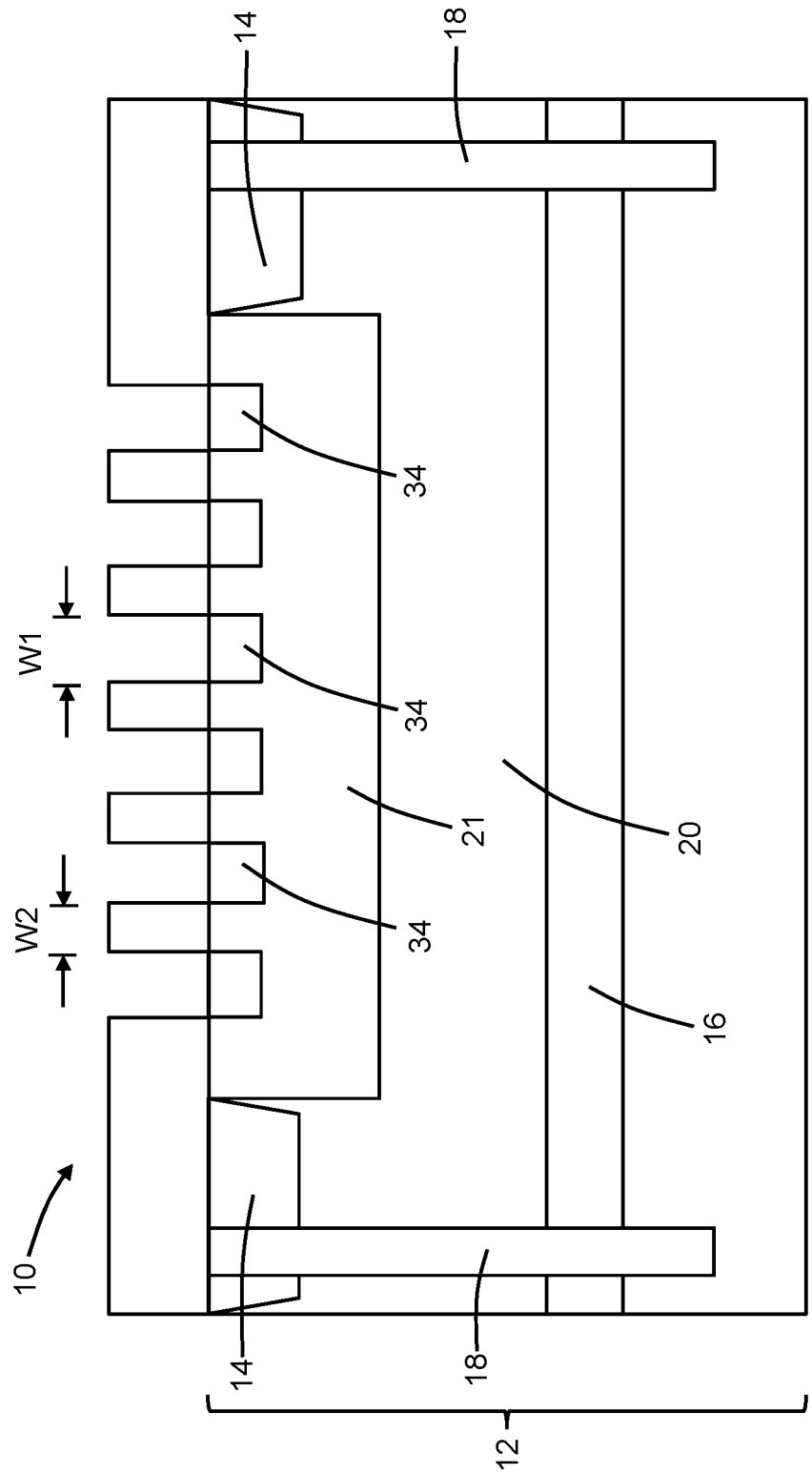
FIG. 3B is a cross-sectional view taken generally along line 3B-3B in FIG. 2.
Figure 4:
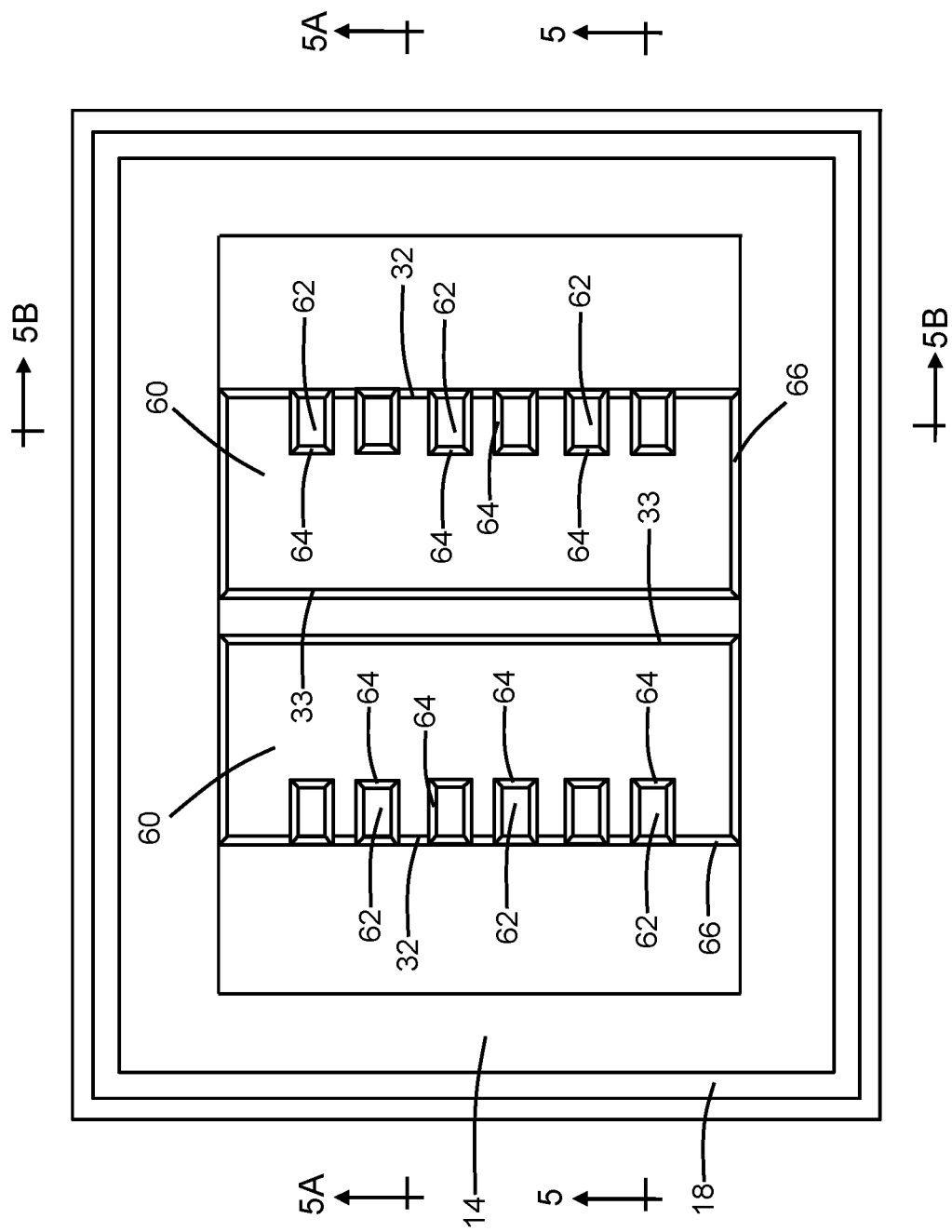
FIG. 4 is a top view of the structure at a fabrication stage subsequent to FIG. 2.
Figure 8:
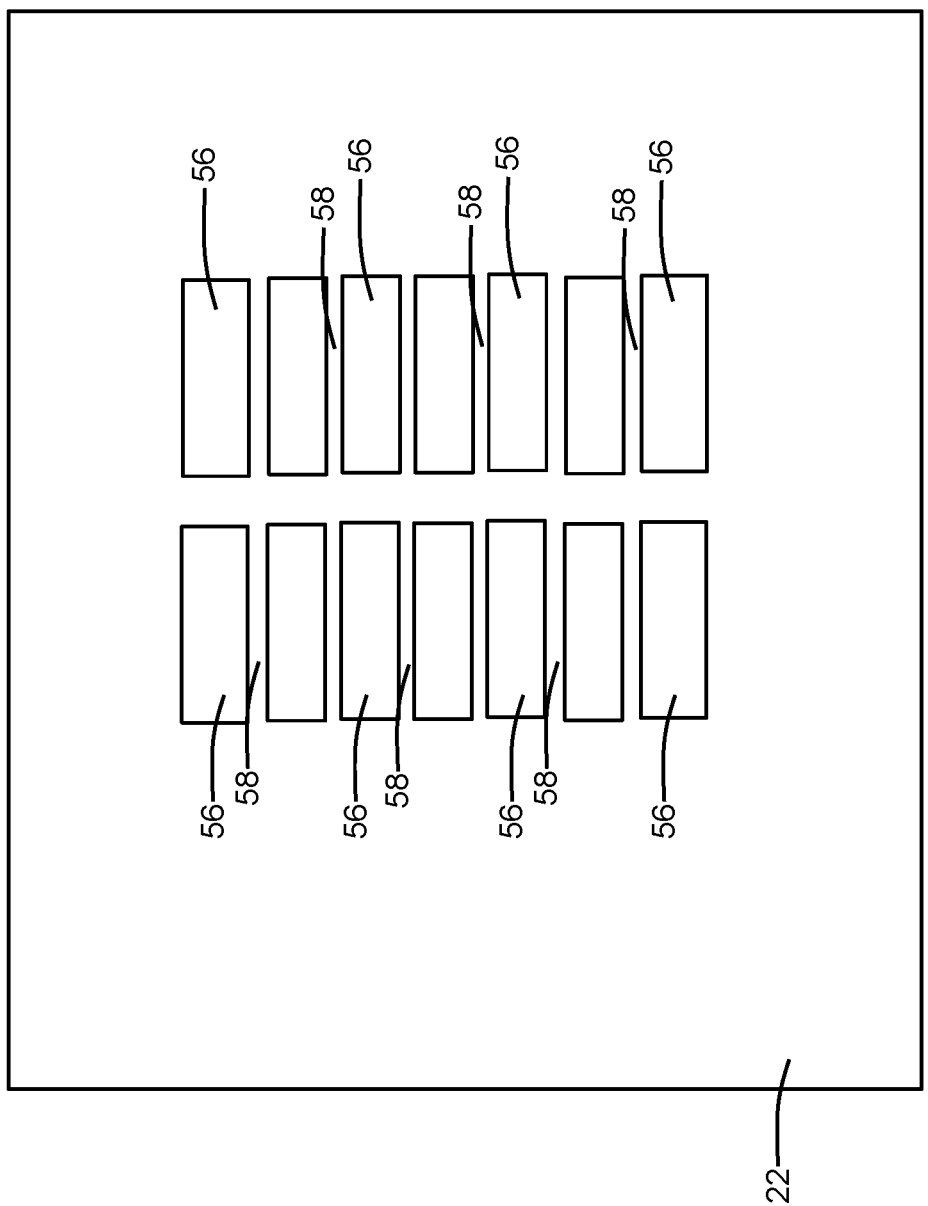
FIG. 8 is a top view of a structure in accordance with alternative embodiments of the invention.
Figure 9:
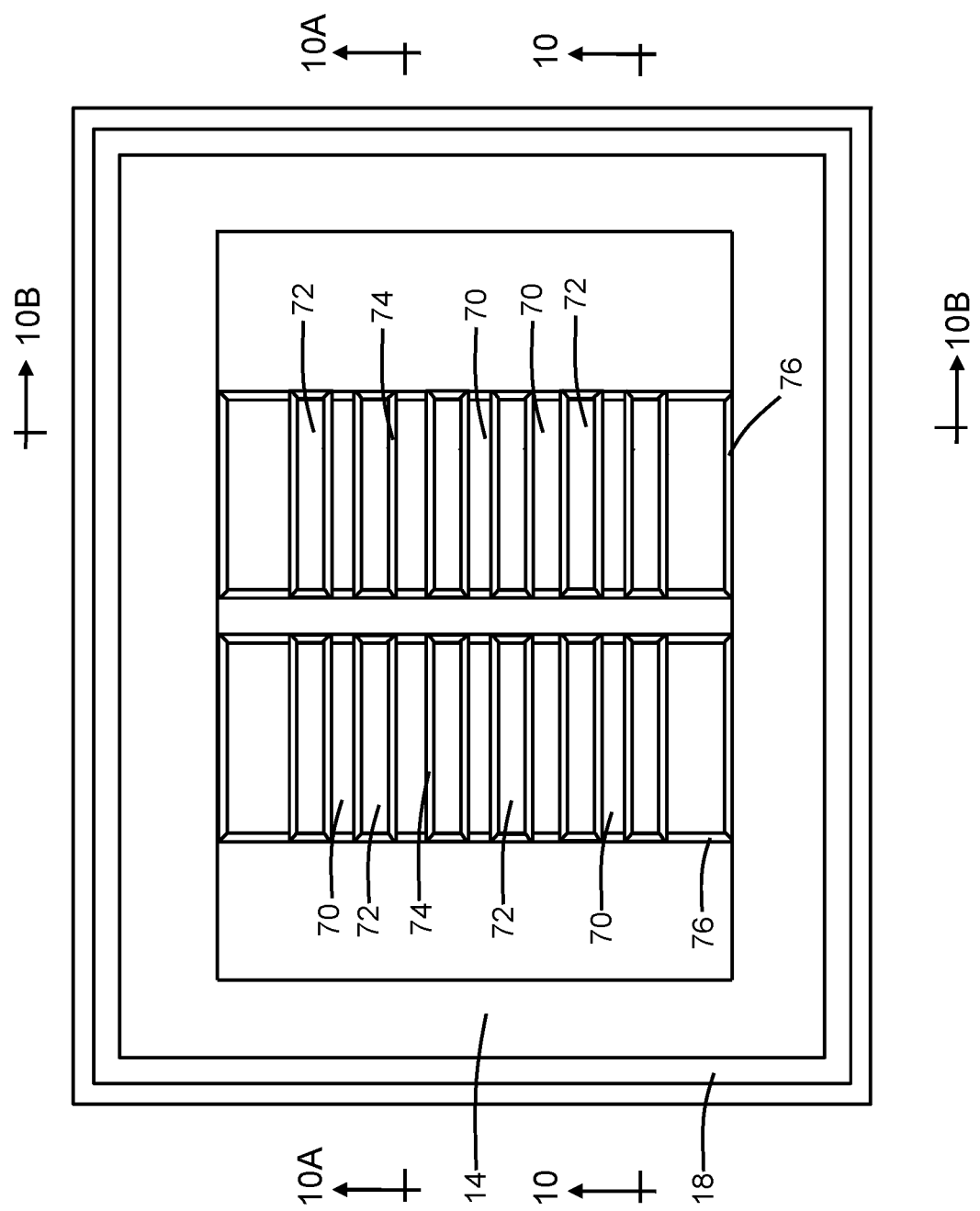
FIG. 9 is a top view of the structure at a fabrication stage subsequent to FIG. 8.
Figure 10:
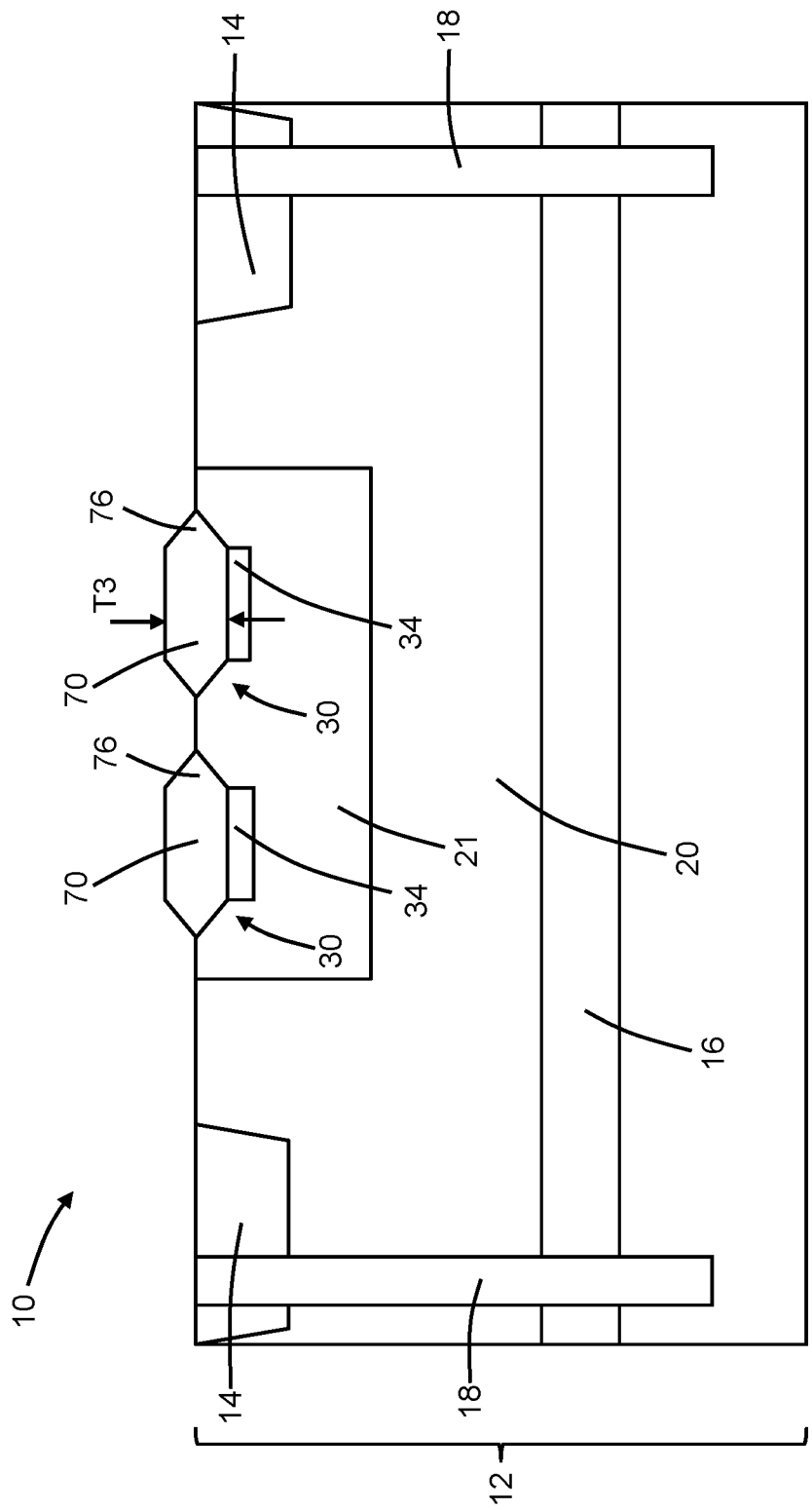
FIG. 10 is a cross-sectional view taken generally along line 10-10 in FIG. 9.
Figure 10A:
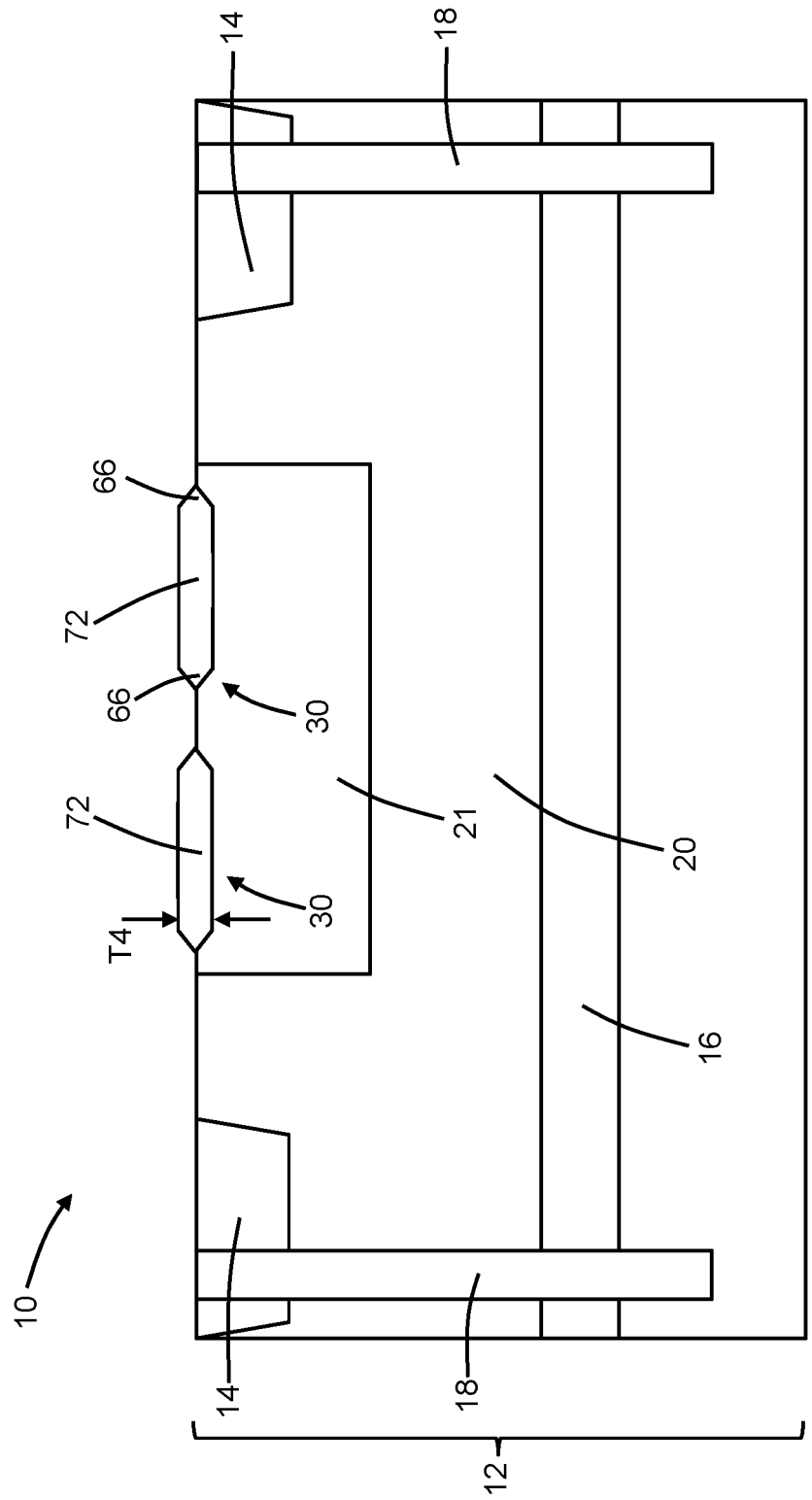
FIG. 10A is a cross-sectional view taken generally along line 10A-10A in FIG. 9.
Figure 10B:
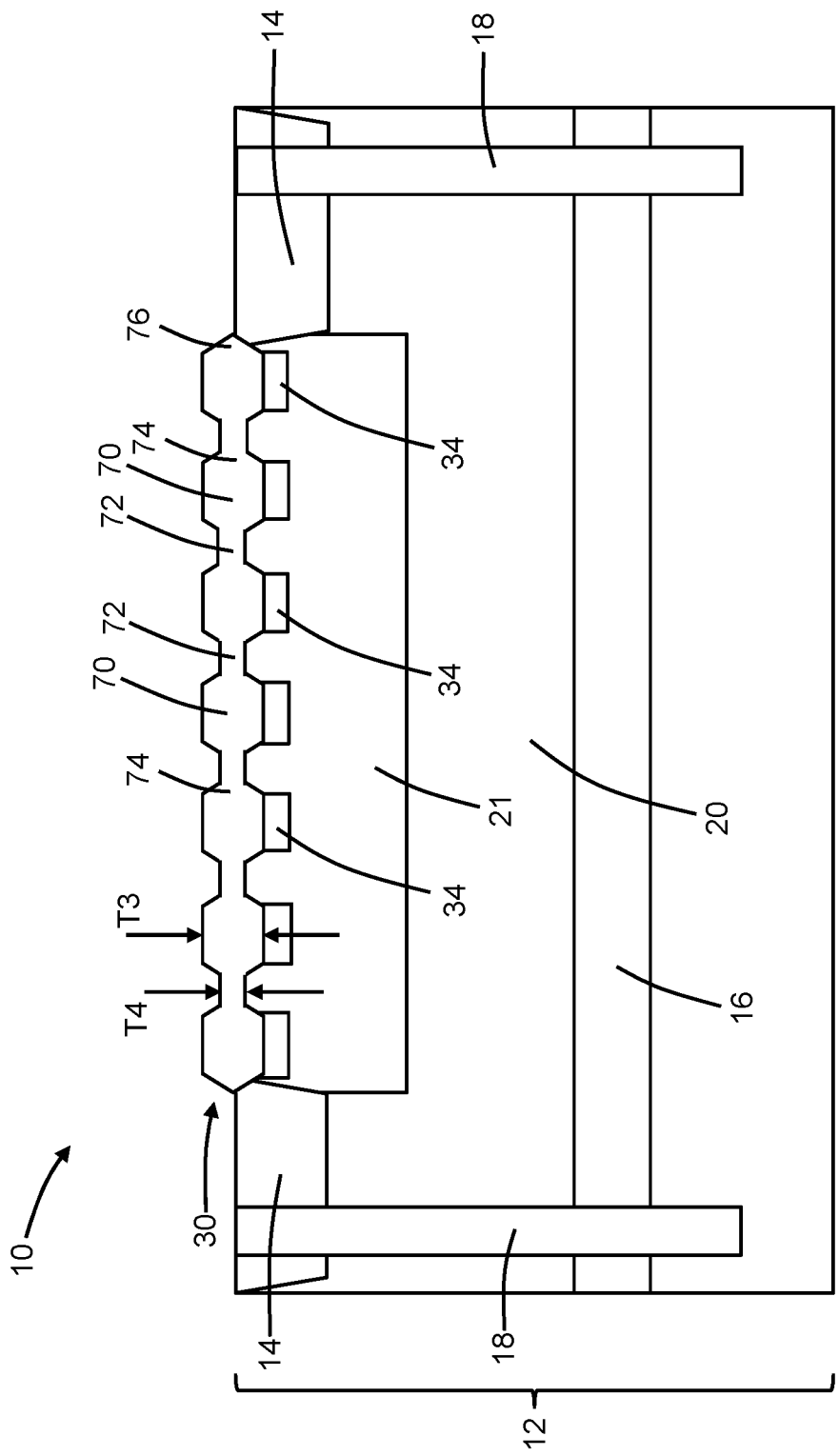
FIG. 10B is a cross-sectional view taken generally along line 10B-10B in FIG. 9.

With reference to FIG. 8 in which like reference numerals refer to like features in FIG. 2 and in accordance with alternative embodiments of the invention, the patterning of the hardmask 22 may be altered to provide multiple openings 56 that are separated by strips 58 of the material of the hardmask 22 instead of notches 24 (FIG. 2). In alternative embodiments, the strips 58 may be widened (i.e., flared with a trapezoidal shape) and the openings 56 concomitantly narrowed (i.e., tapered) proximate to the subsequently-formed source regions 50.

With reference to FIGS. 9, 10, 10A, 10B and at a fabrication stage subsequent to FIG. 8, the doped regions 34 are formed in the substrate 12 at the locations of the openings 56. The strips 58 block implantation such that the doped regions 34 are absent in the substrate 12 beneath the strips 58. The buffer dielectric layers 30 may be formed by thermal oxidation using the hardmask 22 (FIG. 9), and the hardmask 22 may be removed subsequent to the formation of the buffer dielectric layers 30.

Each buffer dielectric layer 30 includes sections 70 having a thickness T3, sections 72 having a thickness T4, and sections 74 that provide a transition between the section 70 and the sections 72. The sections 70 of the buffer dielectric layers 30 may form inside the openings 56. The sections 72 of buffer dielectric layers 30 may form beneath the strips 58. The thickness T4 of the sections 72 is less than the thickness T3 of the sections 70. The shape and dimensions of the sections 70, 72 of each buffer dielectric layer 30 are determined at least in part by the shape and dimensions of the openings 56 and strips 58. In an embodiment, the thickness T3 of the sections 70 of each buffer dielectric layer 30 may be uniform. In an embodiment, the thickness T4 of the sections 72 of each buffer dielectric layer 30 may be uniform. In an embodiment, the thickness T3 of the sections 70 of each buffer dielectric layer 30 may be substantially uniform. In an embodiment, the thickness T4 of the sections 72 of each buffer dielectric layer 30 may be substantially uniform.

The sections 70 and sections 72 have a juxtaposed arrangement and alternate across the width of each buffer dielectric layer 30. Each of the sections 72 is laterally arranged between an adjacent pair of the sections 70. The sections 74 of each buffer dielectric layer 30 taper over a range of intermediate thicknesses from the thickness T3 at the intersections with the sections 70 to the thickness T4 at the intersection with the sections 72. The sections 70, 72 of each buffer dielectric layer 30 also include peripheral sections 76 representing bird's beaks for which the dielectric material tapers to a zero thickness.

The gate electrode 42 only partially overlaps with the sections 72 of the buffer dielectric layer 30, which extend from the side edge 32 to the side edge 33 of the buffer dielectric layer 30. The doped regions 34 are only positioned beneath the sections 70 of the buffer dielectric layers 30. In an embodiment, the doped regions 34 may be coextensive with the sections 70 of the buffer dielectric layers 30. The doped regions 34 are not positioned beneath the sections 72 of the buffer dielectric layers 30. Instead, portions of the drift well 21 are positioned beneath the sections 72 of the buffer dielectric layers 30. In an embodiment, the portions of the drift well 21 may be coextensive with the sections 72 of the buffer dielectric layers 30.

The process flow continues to complete the structure 10 as previously described.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor device, the structure comprising:
   a semiconductor substrate;
   a drift well in the semiconductor substrate;
   a source region and a drain region in the semiconductor substrate;
   a gate dielectric layer on the semiconductor substrate;
   a buffer dielectric layer on the semiconductor substrate over the drift well, the buffer dielectric layer including a first side edge adjacent to the drain region, a second side edge that abuts the gate dielectric layer, a first section extending from the second side edge to the first side edge, and a plurality of second sections extending from the second side edge toward the first side edge, the first section having a first thickness, and each of the second sections having a second thickness less than the first thickness; and
   a gate electrode laterally positioned between the source region and the drain region, the gate electrode including a first portion that overlaps with the buffer dielectric layer and a second portion that overlaps with the gate dielectric layer,
   wherein the plurality of second sections of the buffer dielectric layer alternate with portions of the first section of the buffer dielectric layer along the second side edge.

2. The structure of claim 1 wherein the gate electrode fully overlaps with the second sections of the buffer dielectric layer.

3. The structure of claim 1 wherein the gate electrode partially overlaps with the second sections of the buffer dielectric layer.

4. The structure of claim 1 wherein each of the second sections is joined to the first section of the buffer dielectric layer by a third section, and the third section tapers has a third thickness that tapers from the first thickness to the second thickness.

5. The structure of claim 1 wherein the gate dielectric layer has a third thickness that is less than the first thickness and less than the second thickness.

6. The structure of claim 1 wherein the first section separates the second sections from the drain region.

7. The structure of claim 1 further comprising:
   a doped region in the drift well, the doped region positioned beneath the first section of the buffer di electric layer,
   wherein the drift well is doped to have a first conductivity type, and the doped region is doped to have a second conductivity type different than the first conductivity type.

8. The structure of claim 7 wherein the doped region is coextensive with the first section of the buffer dielectric layer.

9. The structure of claim 7 wherein the drift well is coextensive with the second sections of the buffer dielectric layer.

10. The structure of claim 7 wherein the doped region is absent beneath the second sections of the buffer dielectric layer.

11. The structure of claim 1 wherein the second side edge of the buffer dielectric layer abuts the gate dielectric layer.

12. The structure of claim 11 wherein the gate dielectric layer is positioned between the second side edge of the buffer dielectric layer and the source region.

13. The structure of claim 1 wherein the buffer dielectric layer comprises silicon dioxide.

14. A method of forming a structure for a laterally-diffused metal-oxide-semiconductor device, the method comprising:
   forming a drift well in a semiconductor substrate;
   forming a source region and a drain region in the semiconductor substrate;
   forming a gate dielectric layer on the semiconductor substrate;
   forming a buffer dielectric layer on the semiconductor substrate over the drift well; and
   forming a gate electrode laterally positioned between the source region and the drain region,
   wherein the buffer dielectric layer includes a first side edge adjacent to the drain region, a second side edge adjacent to the gate dielectric layer, a first section extending from the second side edge to the first side edge, and a plurality of second sections extending from the second side edge toward the first side edge, the first section has a first thickness, each of the second sections has a second thickness less than the first thickness, and the gate electrode includes a first portion that overlaps with the buffer dielectric layer and a second portion that overlaps with the gate dielectric layer, and
   wherein forming the buffer dielectric layer on the semiconductor substrate over the drift well comprises:
   forming a hardmask on the semiconductor substrate with an opening shaped to provide the first section and the second sections that are formed by a thermal oxidation process with the hardmask on the semiconductor substrate.

15. The method of claim 14 wherein the hardmask includes a plurality of notches that alternate with a plurality of projections along a side edge.

16. The method of claim 14 further comprising:
   forming a doped region in the drift well that is positioned beneath the first section of the buffer dielectric layer,
   wherein the drift well is doped to have a first conductivity type, the doped region is doped to have a second conductivity type different than the first conductivity type, the doped region is coextensive with the first section of the buffer dielectric layer, and the drift well is coextensive with the second sections of the buffer dielectric layer.

17. The method of claim 16 wherein the doped region is absent beneath the second sections of the buffer dielectric layer.

18. The method of claim 14 wherein the gate electrode fully overlaps with the second sections of the buffer dielectric layer.

19. The method of claim 15 wherein the notches and the projections have dimensions selected to provide the second thickness of the second sections.

20. The method of claim 19 wherein the notches are rectangular, and the projections are rectangular.

* * * * *